United States Patent [19]

Rischmüller

[11] Patent Number: 5,204,561
[45] Date of Patent: Apr. 20, 1993

[54] GATE CONTROL CIRCUIT FOR MOS TRANSISTOR

[75] Inventor: Klaus Rischmüller, Aix En Provence, France

[73] Assignee: SGS-Thomson Microelectronics S.A., Gentilly, France

[21] Appl. No.: 552,951

[22] Filed: Jul. 16, 1990

[30] Foreign Application Priority Data

Jul. 17, 1989 [FR] France ............................... 89 09912

[51] Int. Cl.$^5$ .......................................... H03K 17/687
[52] U.S. Cl. .................... 307/571; 307/253; 328/113
[58] Field of Search ................ 328/113, 223; 307/571, 307/253, 577, 584; 331/117 FE; 363/131

[56] References Cited

U.S. PATENT DOCUMENTS

| | | | |
|---|---|---|---|
| 3,337,748 | 8/1967 | Rusch et al. | 307/270 |
| 3,418,495 | 12/1968 | Bose | 307/239 |
| 4,414,479 | 11/1983 | Foley | 307/253 |
| 4,445,055 | 4/1984 | Bete | 307/571 |
| 4,454,454 | 6/1984 | Valentine | 307/584 |
| 4,683,387 | 7/1987 | Jones et al. | 307/571 |
| 4,728,826 | 3/1988 | Einzinger et al. | 307/584 |
| 4,873,460 | 10/1989 | Rippel | 307/571 |
| 4,877,982 | 10/1989 | Walker | 307/584 |
| 4,950,919 | 8/1990 | Rossi et al. | 307/571 |
| 5,010,261 | 4/1991 | Steigerwald | 307/571 |

FOREIGN PATENT DOCUMENTS 3813672 11/1988 Fed. Rep. of Germany.

OTHER PUBLICATIONS

Kazimierczuk, "High-Speed Driver for Switching Power MOSFET's", I.E.E.E. Transactions on Circuits and Systems 35 (1988) Feb., No. 2, New York, pp. 254–256.

Primary Examiner—William L. Sikes
Assistant Examiner—Toan Tran
Attorney, Agent, or Firm—Lowe, Price, Leblanc & Becker

[57] ABSTRACT

A gate control circuit is provided for a power MOS transistor (T) having an input capacitance ($C_e$). The transistor gate is in series with an inductance (L). The inductance is initially precharged. First switch, element (T2, T3) transfers the energy stored in the inductance towards the input capacitance during a switching on condition of the power MOS transistor. Second switch element (T1, T4) transfers back the energy stored in the input capacitance back to the inductance during a switching off condition.

4 Claims, 4 Drawing Sheets

GATE CONTROL CIRCUIT FOR MOS TRANSISTOR

BACKGROUND OF THE INVENTION

The present invention generally relates to the control of a power MOS transistor or other power component having a high input capacitance.

This input capacitance has a non negligible effect since such devices are usually used for switching operation and switching frequencies are increasing to higher and higher values.

FIGS. 1A and 1B are circuit diagrams of two variants of an elementary switching circuit for a power MOS transistor T. In the case represented, the transistor T has a source connected to ground M and a drain connected directly or indirectly to a load to switch electric energy thereto. Transistor T exhibits a gate/source capacitance $C_{gs}$ and a gate/drain capacitance generally called "Miller capacitance" $C_m$. If it is desired to rapidly switch transistor T, it is necessary to rapidly load and unload the input capacitance $C_e$ equivalent to capacitances $C_m$ and $C_{gs}$. For this purpose, circuits exhibiting the features illustrated in FIG. 1A or 1B are used.

The gate G of transistor T can be connected either to a supply terminal 10 (voltage V) or to ground M respectively through switches 11 and 12. However, this connection generally exhibits a series resistor which can be either, as in the case of FIG. 1A, connected between the tap of the switches and the gate, or, as in the case of FIG. 1B, in series with each switch 11 and 12. For each switching operation, energy $CV^2/2$ is dissipated in each corresponding resistor (this energy does not depend upon the resistance but only upon the gate capacitance and the applied voltage). If the frequency becomes very high, a high number of switching events occur every second (a million at one megahertz) and this loss of energy is no longer negligible. If the input capacitance has a value of 10 nF and the input voltage a value of 15 volts, the power consumed for each switching event is 1.13 $\mu$J, that is, an energy consumption of 1.13 J/s at 1 MHz.

It is already known to make circuits wherein there is an inductance in series with the gate of the transistor it is desired to control. However, this series inductance is coupled through a resistor to an inductance having a value L associated with a load transformer. This arrangement shifts the phase of the transistor control with respect to the current in the main load circuit. In those circuits there is a dissipation of about $CV^2/2$ during each switching operation. Moreover, those circuits do not permit modification of the switching frequency since the latter is associated with the circuit resonance frequency and therefore depends upon the values of the chosen inductances and capacitors.

Thus, an object of the invention is to provide a new and improved low dissipation gate control circuit for a power MOS transistor.

Another object of the invention is to provide a new and improved gate control circuit for a power MOS transistor with a voltage higher than the voltage of the supply source.

A further object of the invention is to provide a new and improved switching circuit that can operate over a wide range of switching frequencies.

SUMMARY OF THE INVENTION

To achieve those objects, the invention provides a gate control circuit for a power MOS transistor, exhibiting an input capacitance, wherein this gate is in series with an inductance, comprising means for precharging the inductance; first means for transferring energy stored in the inductance to the input capacitance during an on switching operation; and second means for transferring back to the inductance the energy stored in the input capacitance during an off switching operation.

According to an embodiment of the invention, there is provided an auxiliary capacitance for carrying out the energy transfers to and from the inductance.

According to an embodiment of the invention, the gate control circuit comprises four bridge-connected switches provided with anti-parallel diodes, a diagonal of the bridge being connected to a supply source with a capacitance in parallel and the other diagonal of the bridge being connected through an inductance, one of the inductance terminals being connected to the gate of the power MOS transistor.

According to an embodiment of the invention, the inductance precharging means are connected between the inductance and the MOS transistor gate, the first power transferring means comprising a switch in series with a diode of a first polarity and the second power transferring means comprising a switch and a diode having an opposite polarity.

According to an embodiment of the invention, the inductance terminal not connected to the gate is connected to a first terminal of a circuit comprising a first diode and a switch in parallel with a second diode and another switch, the diodes having an opposite polarity, the other terminal of this parallel circuit being connected to the first terminal of the auxiliary capacitance and to precharging means.

Thus, according to the invention, there is theoretically a zero power consumption in the gate, the power being each time recovered. The only power supply is the initial power supply $CV^2/2$ necessary for the first switching operation.

BRIEF DISCLOSURE OF THE DRAWINGS

The foregoing and other objects, features and advantages of the invention will be apparent from the following detailed description of preferred embodiments as illustrated in the accompanying drawings wherein:

FIGS. 1A and 1B, above described, illustrate conventional gate control circuits;

DETAILED DESCRIPTION OF THE INVENTION

Figure 1A:
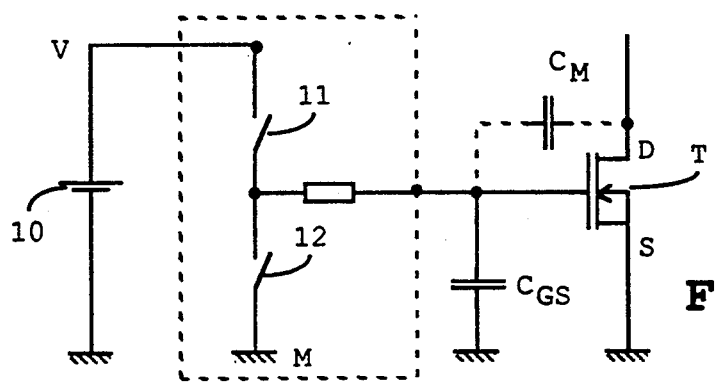
Figure 1B:
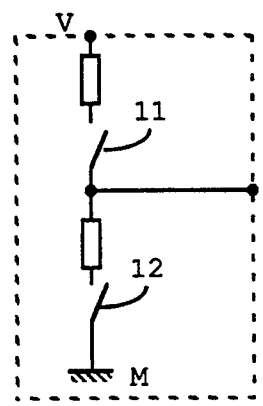
Figure 2:
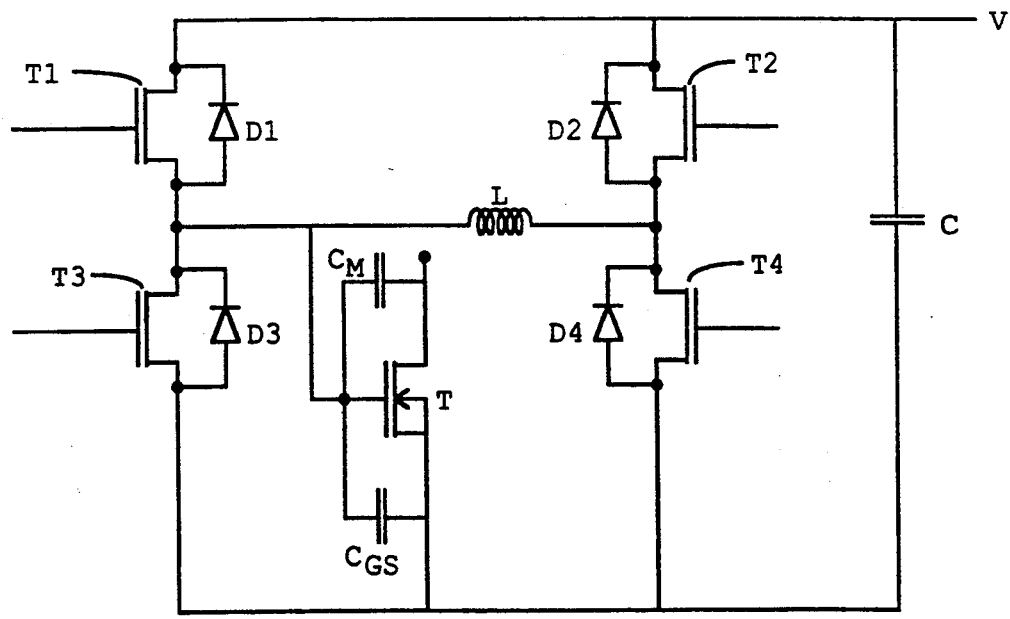
FIG. 2 shows a first embodiment of a gate control circuit according to the invention.

FIG. 2 shows the power transistor T of FIG. 1 with its input capacitances $C_{gs}$ and $C_m$ equivalent to an input capacitance $C_e$. The circuit comprises four switches for example MOS transistors T1–T4, each associated with an anti-parallel diode D1–D4. The common drains of transistors T1 and T2 are connected to a supply source, the common sources of transistors T3 and T4 are grounded. The source of transistor T1 is connected to the drain of transistor T3 and the source of transistor T2 is connected to the drain of transistor T4. The junction of transistors T1 and T3 is connected to the junction of transistors T2 and T4 through an inductance L. Moreover, one of the terminals of inductance L is connected to the gate of the power transistor T that it is desired to switch. A capacitance C in parallel on the supply source V is also illustrated.

Figure 3:
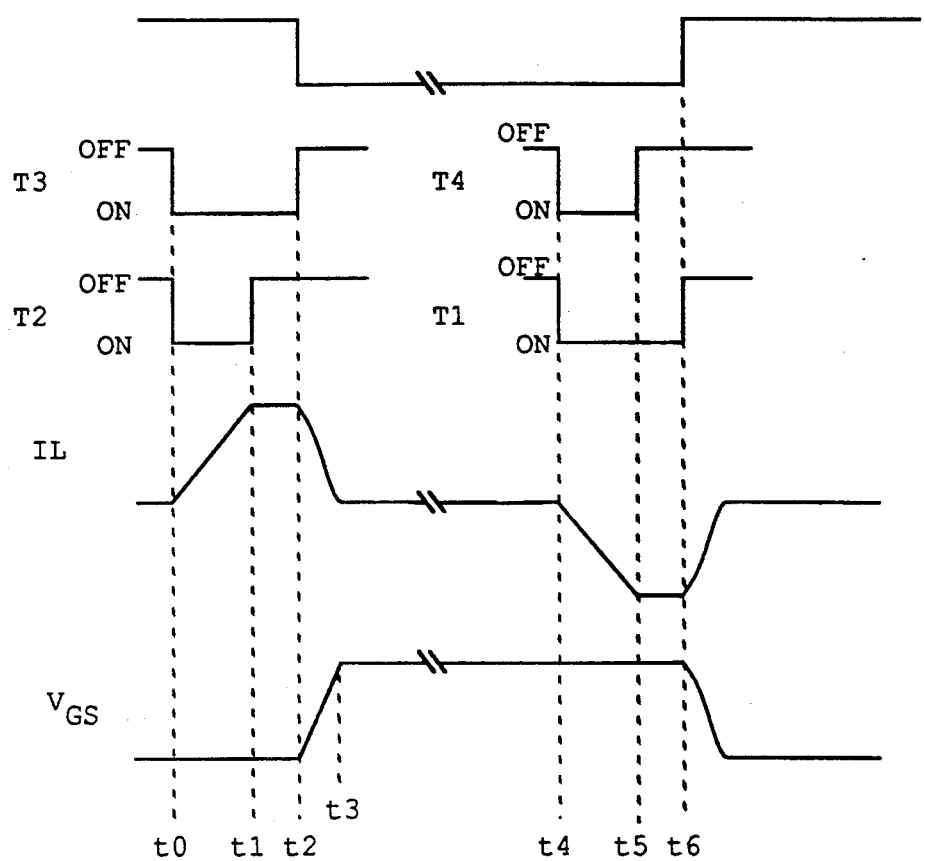
FIGS. 3 and 4 are timing diagrams of possible operations of the circuit shown in FIG. 2.

The operation of this circuit will be explained in relation with the time diagrams illustrated in FIG. 3. It is assumed that initially transistors T1–T4 and T are blocked. At the initial time, t0, the diagonally opposite transistors T2 and T3 are rendered conductive. This causes a current to flow through inductance L, this current increasing until transistor T2 is blocked at a time t1. During this period, a current $I_L$ is reached and energy $LI_1^2/2$ is stored in the inductance. As will be seen hereafter, it is the only power consumption required from the source. After time t1, the current passes through transistor T3 and diode D4. Then if, at a time t2, transistor T3 is blocked, some current is transferred from the inductance into the input capacitance $C_e$ of transistor T, the voltage $V_{gs}$ of which increases until a time t3 when the voltage on the capacitance has reached the value V and a limitation occurs due to the presence of diode D1 and the possible current excess in inductance L is sent back to the source (on capacitance C) through a path passing through diodes D4 and D1 until the inductance is demagnetized.

In order to block transistor T, transistor T4 and transistor T1 are rendered conductive. In a first step, some current flows through the loop comprising the input capacitance, inductance L and transistor T4 at conductive state and the charge stored in the capacitance is transferred from time t4 into inductance L through which flows a current $I_L$ having a reverse direction with respect to that previously considered. At a time t5, transistor T4 is blocked, inductance L retains its energy and current $I_L$ flows in the loop constituted by transistor T1, inductance L and diode D2. When transistor T1 is blocked, at time t6, the current in the inductance is sent back to the source through the path comprising diode D3, inductance L and diode D2.

Thus, one obtains transfers of the power in the tank-capacitor C from the source towards inductance L, then from inductance L towards the input capacitance $C_e$ of the power transistor, then reverse current transfers from $C_e$ towards L and from L towards C. Thus, theoretically, this circuit is liable to repeatedly operate without consuming any power. However, due to losses associated with any electric circuit, it is advisable to regularly charge again capacitor C through a supply source V, although this supply source theoretically serves only for the initial charge of the tank-capacitor C.

Figure 4:
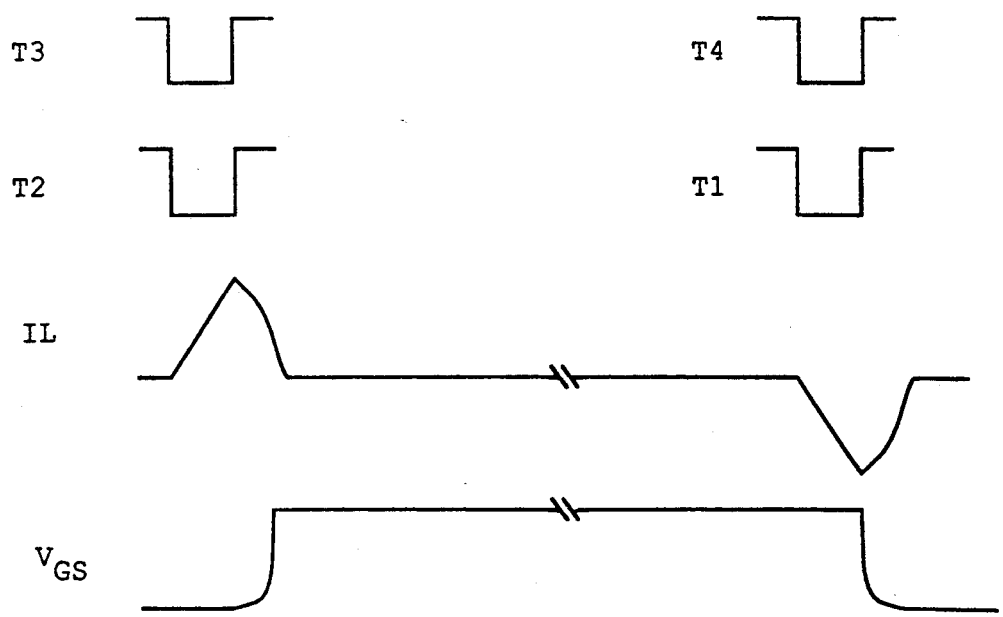

FIG. 4 shows another time diagram of a possible operation of the circuit according to the invention wherein, at the switching on, transistors T3 and T2 are simultaneously blocked and, at the switching off, transistors T4 and T1; that is, there is no free-wheel intermediate operation of the charge in inductance L.

According to a further advantage of the invention, it will be noted that, as known by those skilled in the art, injecting charges in the input capacitance or discharging the input capacitance of a power transistor through a self-inductance permits faster charging and discharging times than with resistors.

It will also be noted that the gate control circuit according to the invention is independent of the main power transistor circuit and that its operation frequency can be freely chosen.

Moreover, for reasons of optimization, those skilled in the art may prefer to arrange an additional capacitor in parallel on the input capacitance $C_e$.

Figure 5:
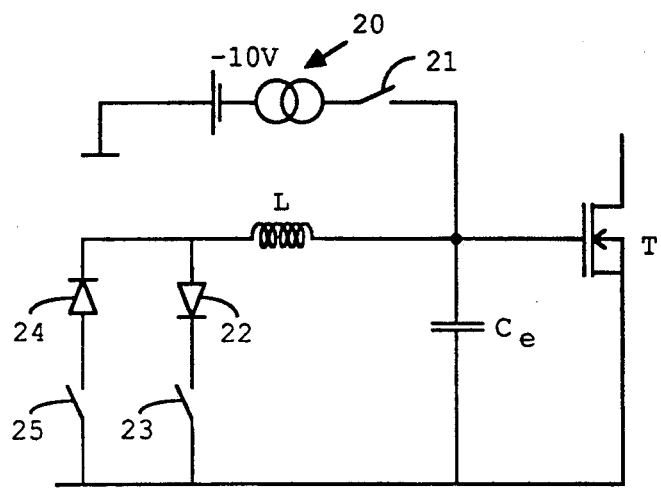
FIG. 5 shows a second embodiment of the invention.

FIG. 5 illustrates another embodiment of the invention. The power transistor T, its input capacitance $C_e$ and inductance L are shown again. An auxiliary source 20 permits precharge of capacitance $C_e$ at a chosen negative voltage, for example −10 volts. This auxiliary source may be isolated from the input circuit by means of a switch 21. The inductance L is grounded, on the one hand, through a first diode 22 in series with a switch 23 and, on the other hand, through a diode 24 in series with a switch 25, diodes 22 and 24 having opposite polarity. Switches 23 and 25 may conventionally be MOS transistors as previously described.

Figure 6:
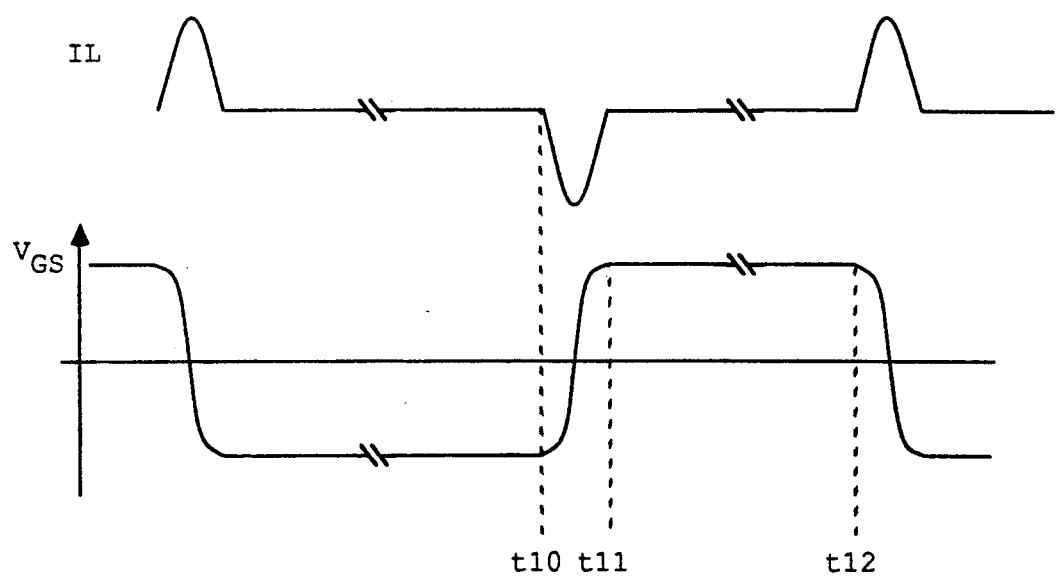
FIG. 6 shows time diagrams associated with the circuit of FIG. 5.

The operation of the circuit shown in FIG. 5 will be explained in relation with FIG. 6 which illustrates current $I_L$ in the inductance and voltage $V_{gs}$ on the gate of the power transistor T.

Considering the initial state at time t10 when the capacitance is charged at −10 volts and when there is no current flowing in the inductance and switch 25 is switched on, a negative current will flow through the diode and the polarity across the terminals of the capacitance will be inverted to pass from a negative value, for example −10 volts, to a positive value, for example +10 volts, at a time t11, at the moment switch 25 is switched off again (it will be noted that this positive value is liable to exceed 10 volts if switch 25 is switched on for a longer time period). The charge is then normally maintained on the capacitance and is reversed again at time t12 when switch 23 is switched on.

Thus, owing to repeated power transfers on capacitance $C_e$ through inductance L, it is possible to control the switching of transistor T without consuming any power.

However, due to current losses associated to any circuit, switch 21 has to be regularly switched on during the negative charging phases of the gate to compensate for losses when negatively charging again capacitance $C_e$.

It will be appreciated that in this embodiment, the capacitance $C_e$ can be considered either as the gate capacitance which is charged to turn on the power transistor T or as an auxiliary capacitor which is reverse charged to store the charges necessary for the subsequent charging according to the other polarity of this capacitor.

Figure 7:
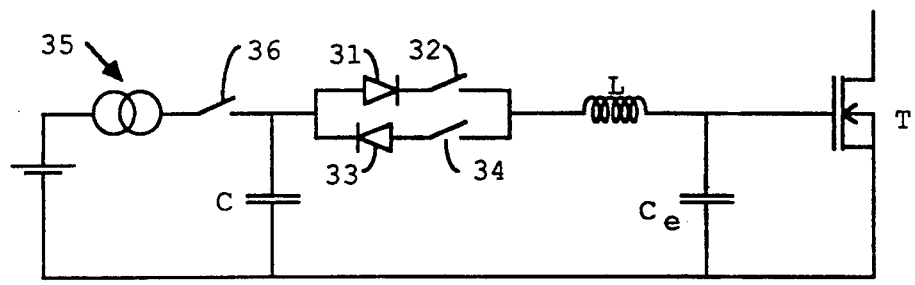
FIG. 7 shows a third embodiment of a circuit according to the invention.

FIG. 7 shows a third embodiment of the invention wherein the components present in the previous embodiments have the same references. The second terminal of inductance L, not connected to the gate of the power transistor T, is connected to an auxiliary capacitor C, the other terminal of which is grounded through a parallel connection of a first diode 31 in series with a switch 32 and of a second diode 33 in series with a switch 34. Diode 31 is reverse biased with respect to diode 33. Here, as in the previous embodiment, the charges are exchanged through inductance L between capacitance $C_e$ and the auxiliary capacitor C which can be considered as a tank-capacitor initially charged and periodically charged again by a current source 35 during time periods determined by a switch 36.

Figure 8:
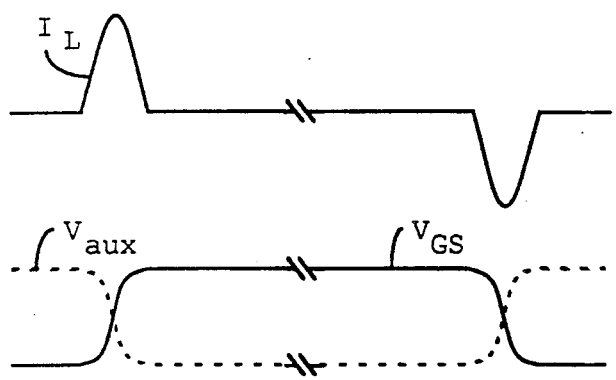
FIG. 8 represents time diagrams illustrating the operation of the circuit shown in FIG. 7.

FIG. 8 shows the variation of current $I_L$ as a function of the switching of switches 32 and 34 as well as the variation of the gate voltage $V_{gs}$ of the power transistor T, and, in dotted lines, the charge variation on the auxiliary capacitor C.

Figure 9:
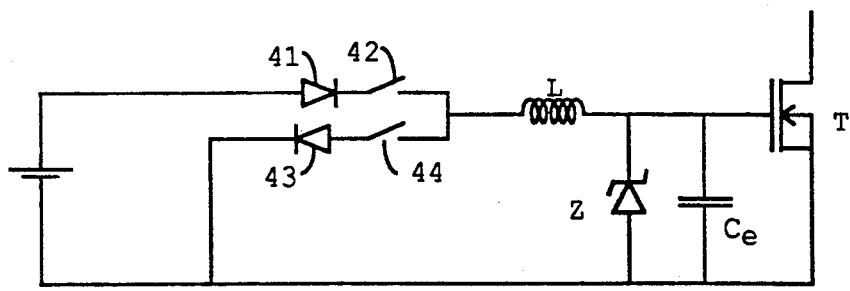
FIG. 9 shows a fourth embodiment of a circuit according to the invention.

FIG. 9 shows a fourth embodiment of the invention wherein the components present in the previous embodiments have the same references. The second terminal of inductance L, not connected to the gate of the power transistor T, is connected to a parallel circuit of a first diode 41 in series with a switch 42 and a second diode 43 in series with a switch 44. Diode 41 is reverse biased with respect to diode 43. Diode 41 is connected to a positive supply source and diode 43 is grounded. Moreover, a zener diode Z is connected across the terminals of capacitance $C_e$. Thus, at each switching on operation of switch 42, $C_e$ is charged at a limited voltage through the zener diode and which can be higher than that of the positive supply source. This embodiment meets the requirements of the second object of the invention.

Those skilled in the art will be able to devise various variants of the invention, the basic aspect of which is the fact that, for a power switch having an input capacitance and being switch-controlled, the control is carried out through charge transfer between its input capacitance and an auxiliary capacitor through an inductance serving to store energy. In a preferred embodiment of the invention, the input capacitance can serve as an auxiliary capacitor during the blocking phases of the power transistor.

I claim:

1. A gate control circuit for a power component with a capacitive input such as a power MOS transistor exhibiting an input capacitance, wherein a gate of said power component is in series with an inductance, said inductance being precharged, comprising:
    first means comprising a first switch in series with a diode of a first polarity for transferring energy stored in the inductance to the input capacitance during a switching on condition of said power component; and
    second means comprising a second switch in series with a diode of a second polarity for transferring back to the inductance energy stored in the input capacitance during a switching off condition of said power component.

2. A gate control circuit for a power component with a capacitive input such as a power MOS transistor exhibiting an input capacitance, wherein a gate of said power component is in series with an inductance, comprising:
    an auxiliary capacitor;
    means for precharging said auxiliary capacitor;
    first means comprising a first switch in series with a diode of a first polarity for transferring energy stored in the auxiliary capacitor through said inductance to the input capacitance during a switching on condition of said power component; and
    second means comprising a second switch in series with a diode of a second polarity for transferring back to the auxiliary capacitor through the inductance energy stored in the input capacitance during a switching off condition of said power component.

3. A gate control circuit for a power component with a capacitive input such as a power MOS transistor exhibiting an input capacitance, wherein a gate of said power component is in series with an inductance, said inductance being precharged, comprising:
    first means for transferring energy stored in the inductance to the input capacitance during a switching on condition of said power component; and
    second means for transferring back to the inductance energy stored in the input capacitance during a switching off condition of said power component;
    wherein said first and second transferring means are formed by four switches with anti-parallel diodes to form a bridge, a first diagonal of said bridge being connected across a supply source having a capacitor in parallel therewith and a second diagonal of said bridge being connected across said inductance, one of the terminals of said inductance being connected to the gate of the power MOS transistor.

4. A gate control circuit for a power component with a capacitive input such as a power MOS transistor exhibiting an input capacitance, wherein a gate of said power component is in series with one end of an inductance, comprising:
    means for precharging said input capacitance;
    first means connected to the other end of said inductance for transferring energy stored in the input capacitance through said inductance during a switching on condition of said power component; and
    second means connected to the other end of said inductance for transferring back energy stored in the input capacitance through said inductance during a switching off condition of said power component;
    wherein said means for precharging said input capacitance are connected between said inductance and the gate of the MOS transistor, the first transferring means comprise a switch in series with a diode of a first polarity and the second transferring means comprise a switch and a diode having an opposite polarity.

* * * * *